US009413305B2

(12) United States Patent
Zhou et al.

(10) Patent No.: US 9,413,305 B2
(45) Date of Patent: Aug. 9, 2016

(54) FEEDBACK-BASED TRANS-IMPEDANCE AMPLIFIER WITH PROGRAMMABLE INPUT IMPEDANCE

(75) Inventors: Dacheng Zhou, Fort Collins, CO (US); Daniel A. Berkram, Loveland, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 44 days.

(21) Appl. No.: 14/391,300

(22) PCT Filed: Apr. 30, 2012

(86) PCT No.: PCT/US2012/035906
§ 371 (c)(1),
(2), (4) Date: Oct. 8, 2014

(87) PCT Pub. No.: WO2013/165381
PCT Pub. Date: Nov. 7, 2013

(65) Prior Publication Data
US 2015/0034806 A1    Feb. 5, 2015

(51) Int. Cl.
*H03F 3/08* (2006.01)
*H03F 1/08* (2006.01)
*H04B 10/43* (2013.01)

(52) U.S. Cl.
CPC ............ *H03F 3/08* (2013.01); *H03F 1/086* (2013.01); *H03F 3/082* (2013.01); *H03F 2200/255* (2013.01); *H03F 2200/405* (2013.01); *H03F 2200/72* (2013.01); *H04B 10/43* (2013.01)

(58) Field of Classification Search
CPC .................... H03F 2200/255; H03F 1/086

USPC ............... 250/214 A; 398/208, 209; 330/308
See application file for complete search history.

(56) References Cited

U.S. PATENT DOCUMENTS

| 6,037,841 | A | * | 3/2000 | Tanji | H03F 3/082 250/214 A |
|---|---|---|---|---|---|
| 6,275,114 | B1 | | 8/2001 | Tanji et al. | |
| 6,816,010 | B2 | | 11/2004 | Seetharaman et al. | |
| 6,862,322 | B1 | | 3/2005 | Ewen et al. | |
| 7,023,280 | B2 | | 4/2006 | Seetharaman et al. | |
| 7,305,190 | B2 | | 12/2007 | Mayampurath et al. | |
| 7,973,602 | B2 | | 7/2011 | Shivaram et al. | |
| 8,093,954 | B1 | | 1/2012 | Lombaard | |
| 2009/0051442 | A1 | | 2/2009 | Seo et al. | |

FOREIGN PATENT DOCUMENTS

CN    1417945 A    5/2003

OTHER PUBLICATIONS

International Searching Authority, The International Search Report and the Written Opinion, Dec. 28, 2012, 10 Pages.

* cited by examiner

*Primary Examiner* — Thanh Luu
(74) *Attorney, Agent, or Firm* — Conley Rose, P.C.

(57) ABSTRACT

In at least some examples, a communication device includes a photo-diode to convert an optical signal into an electrical current and a feedback-based trans-impedance amplifier to amplify the electrical current. The communication device also includes a transmission line between the photo-diode and the feedback-based trans-impedance amplifier. The feedback-based trans-impedance amplifier includes a programmable input impedance that has been matched to an impedance of the transmission line.

12 Claims, 8 Drawing Sheets

US 9,413,305 B2

FEEDBACK-BASED TRANS-IMPEDANCE AMPLIFIER WITH PROGRAMMABLE INPUT IMPEDANCE

BACKGROUND

For optical communications, the input optical pulse from the optical fiber is received and converted into electrical current through a photo-diode. A trans-impedance amplifier (TIA) may then be employed to convert input current into voltage output. Since the electrical current output by the photo-diode is very small (e.g., on the order of 20 μA), the TIA is placed next to the photo-diode.

BRIEF DESCRIPTION OF THE DRAWINGS

For a detailed description of illustrative examples of the disclosure, reference will now be made to the accompanying drawings in which.

NOTATION AND NOMENCLATURE

Figure 1:
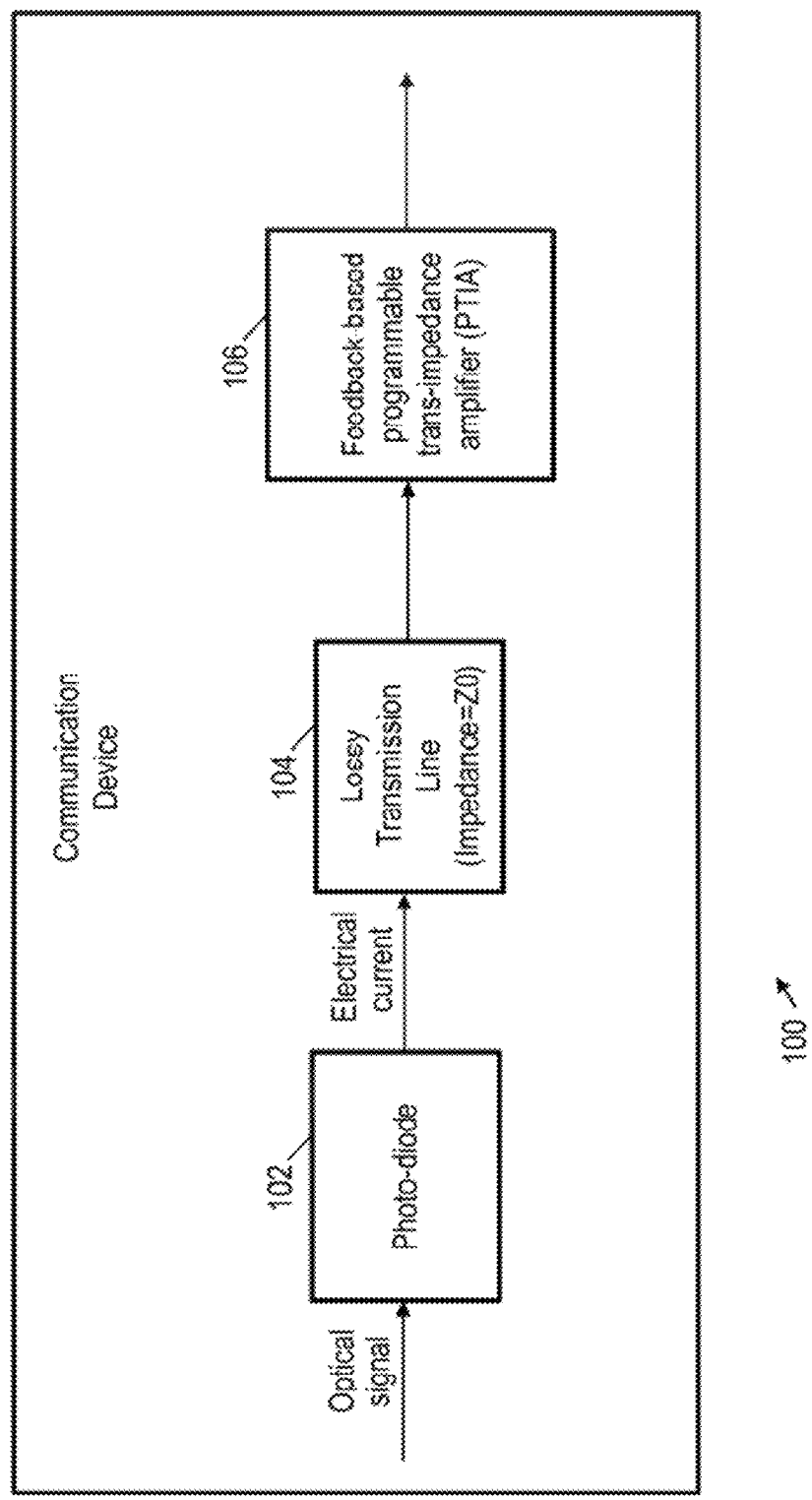
FIG. 1 shows a communication device in accordance with an example of the disclosure.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

Due to imperfect integrated circuit manufacturing processes, the input impedance of a trans-impedance amplifier (TIA) varies regardless of efforts to design for a particular input impedance. Also, transmission line impedance may vary due to variations and imperfections in the materials/designs for transmission lines. If the TIA input impedance does not match the transmission line impedance, the input signal will be distorted due to reflection noise. In an optical communications application, the output current from a photo-diode is very small (e.g., 20 μA to 100 μA) and any signal distortion makes it difficult or impossible to recapture the data. Instead of placing a TIA close to the photo-diode to avoid signal distortion to the very small current output from a photo-diode, disclosed examples use a TIA with a programmable input impedance that is adjusted to match a transmission line impedance. Further, in some examples, MOSFET transistors may be used rather than bipolar devices.

A TIA with a programmable input impedance is referred to herein as a programmable TIA (PTIA). In at least some disclosed examples, a feedback-based PTIA is part of a communication device that receives optical signals and processes corresponding electrical signals. In the communication device, a photo-diode converts optical signals to electrical current. The electrical current from the photo-diode is received by the feedback-based PTIA via a transmission line. The transmission line between the photo-diode and the feedback-based PTIA is due to, for example, the feedback-based PTIA being on integrated circuit (IC) chip that is separate from the photo-diode. In some examples, the feedback-based PTIA is implemented on an IC chip with other receiver components to reduce overall cost, power, thermal solution and latency requirements for the receiver. With the feedback-based PTIA separated from the photo-diode by a transmission line, the impedance of the transmission line and other noise coupling issues need to be addressed. The proposed feedback-based PTIA resolves signal reflection problems due to non-matched transmission line impedance and feedback-based PTIA input impedance by adjustment of the feedback-based PTIA input impedance to match the impedance of the transmission line. Adjustments to the Input impedance of the feedback-based PTIA may occur either through post-silicon calibration (before the chip with the feedback-based PTIA is installed in a consumer communication device) or through system programming (after the chip with the feedback-based PTIA is installed in a consumer communication device). In either case, the adjustments may be based on an analysis of the output signal for the feedback-based PTIA. The disclosed PTIA examples replace the existing technique of placing a TIA next to the photo-diode.

FIG. 1 shows a communication device 100 in accordance with an example of the disclosure. The communication device 100 corresponds to an end-node (data sink) or routing device of an optical communication network. As show, the communication device 100 comprises a photo-diode 102 that receives an optical signal and outputs a corresponding electrical current. The electrical current is propagated via a lossy transmission line 104 (with impedance=Z0) to a feedback-based PTIA 106. The feedback-based PTIA 106 converts the electrical current received from the photo-diode 102 via the lossy transmission line 104 to a voltage. As disclosed herein, the input impedance of the feedback-based PTIA 106 is adjusted to match to an impedance of the transmission line.

In some embodiments, input impedance of the feedback-based PTIA 106 is adjusted based on a control signal to a variable resistor. The control signal is based on analysis of an output signal of the feedback-based PTIA 106 either before or after the feedback-based PTIA 106 is installed in the communication device 100.

In some examples, the feedback-based PTIA 106 comprises four common source amplifier stages. Further, the last amplifier stage of the feedback-based PTIA 106 may provide voltage level shifting for an output signal and for a common mode signal of the feedback-based PTIA 106. Further, the feedback-based PTIA 106 may comprise a low-pass filter to enable a differential output (an output signal and a common mode reference signal) from the feedback-based PTIA 106. More specifically, low-pass filtering may be used for the common mode reference signal and omitted for the output signal of the feedback-based PTIA 106. In some examples, the feedback-based PTIA 106 is part of an integrated circuit that is separate from the photo-diode 102 and the transmission line 104. For example, the photo-diode 102 may be part of an optical module. Meanwhile, the transmission line 104 may correspond to semiconductor packaging and/or a conductive trace between an integrated circuit with the feedback-based PTIA 106 and the photo-diode 102.

To summarize, for the feedback-based PTIA 106, a programmable feedback resistor is used to feedback the output from third amplifier stage into the input amplifier stage with both DC and negative AC gain. The programmable feedback resistor reduces the input impedance of the feedback-based PTIA 106 to R_fb/(A+1), where R_fb is the feedback resistor value and A is the open gain of the first three amplifier stages. The value for R_fb may be determined, for example, during a wafer test in which the PTIA input voltage is measured when there is zero current and a small current injected into the TIA input. The voltage different is compared with a target voltage (V=I*Z0), where Z0 is the transmission line impedance to be matched. If the measured voltage value is higher than the target voltage, R_fb should be reduced. Alternatively, if the measured voltage is lower than the target voltage, R_fb should be increased. Another way to determine the value of R_fb is to analyze the eye-opening corresponding to the output of the feedback-based PTIA 106, and to sweep across the available values for R_fb (e.g., from low to high) until an optimal setting is determined. By adjusting R_fb so that the input impedance of the feedback-based PTIA 106 matches the impedance of the transmission line at the input as disclosed herein, reflections are reduced. Further, some examples of the disclosed feedback-based PTIA 106 have a common mode voltage feedback structure that is able to tolerate high process and voltage variation as well as swing control. By omitting inductors and cascading structures, some examples of the disclosed feedback-based PTIA 106 are very small and are suitable for low voltage operation. Further, some examples of the disclosed examples of feedback-based PTIA 106 have the advantage of low inherent thermal noises.

Figure 2:
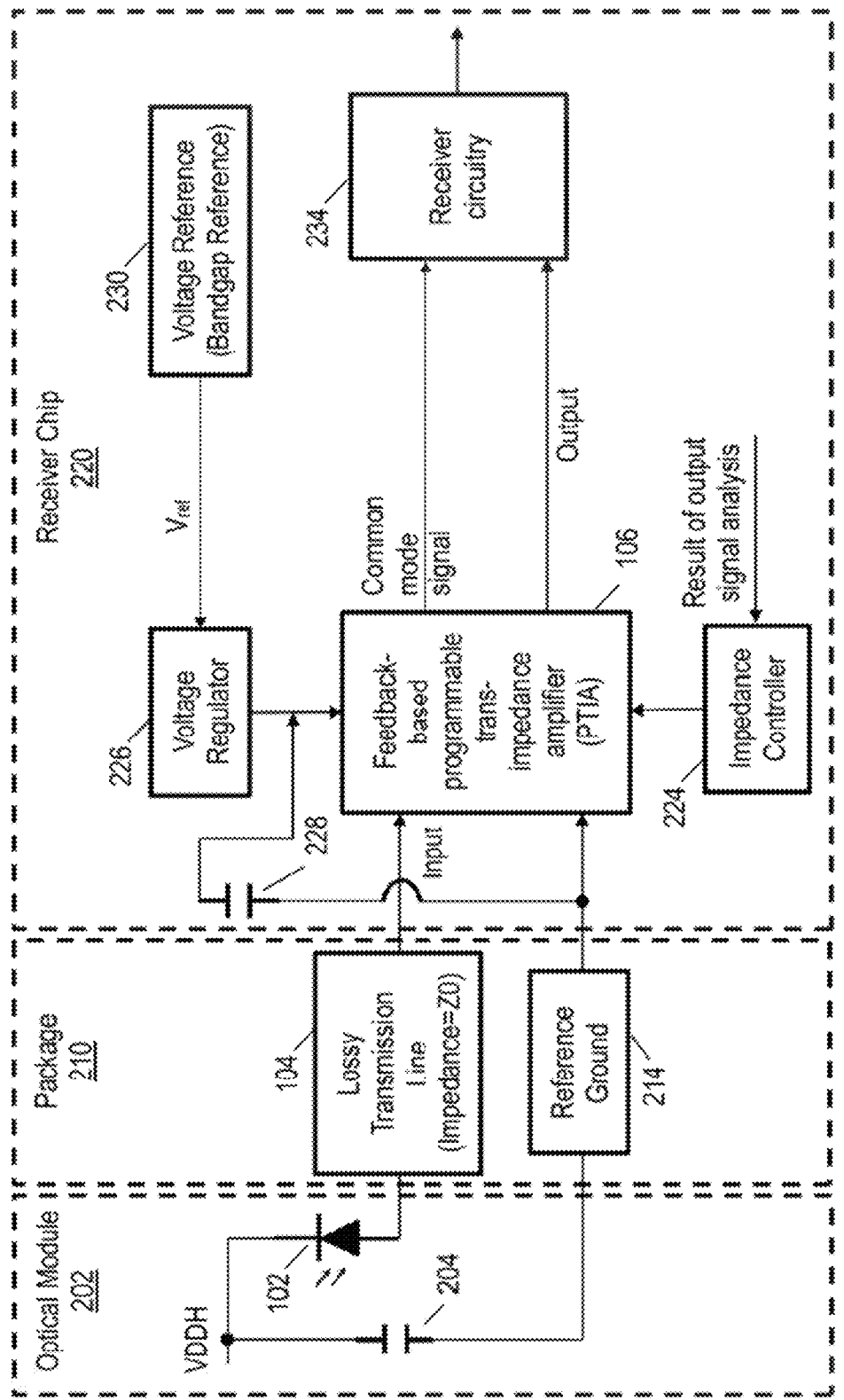
FIG. 2 shows an arrangement of communication device components in accordance with an example of the disclosure.

FIG. 2 shows an arrangement 200 of communication device components in accordance with an example of the disclosure. Without limitation to other examples, the arrangement 200 may be used for the communication device 100 of FIG. 1. In the arrangement 200, various components are shown to be part of an optical module 202, a package 210, and a receiver chip 220. More specifically, the optical module 202 comprises a capacitor 204 and a photo-diode 102 as described for the communication device 100 of FIG. 1. Further, the package 210 comprises a reference ground 214 and a lossy transmission line 104 as described for the communication device 100 of FIG. 1. Further, the receiver chip 220 comprises various components as well as a feedback-based PTIA 106 as described for the communication device 100 of FIG. 1.

As shown, the feedback-based PTIA 106 receives its input from the lossy transmission line 104 and also receives the reference ground 214 via package 210. The receiver chip 220 also comprises a voltage reference 230, a voltage regulator 226, and a capacitor 228 to provide a reference voltage to the feedback-based PTIA 106. The input impedance of the feedback-based PTIA 106 is adjustable by impedance controller 224, which provides a control signal to the feedback-based PTIA 106. The control signal from the impedance controller 224 is based on instructions or information corresponding to the result of analyzing the output signal of the feedback-based PTIA 106. As shown, the feedback-based PTIA 106 outputs a common mode signal and an output signal. The common mode signal and the output signal from the feedback-based PTIA 106 are received by receiver circuitry 234, which may perform operations to recover received data.

Figure 3:
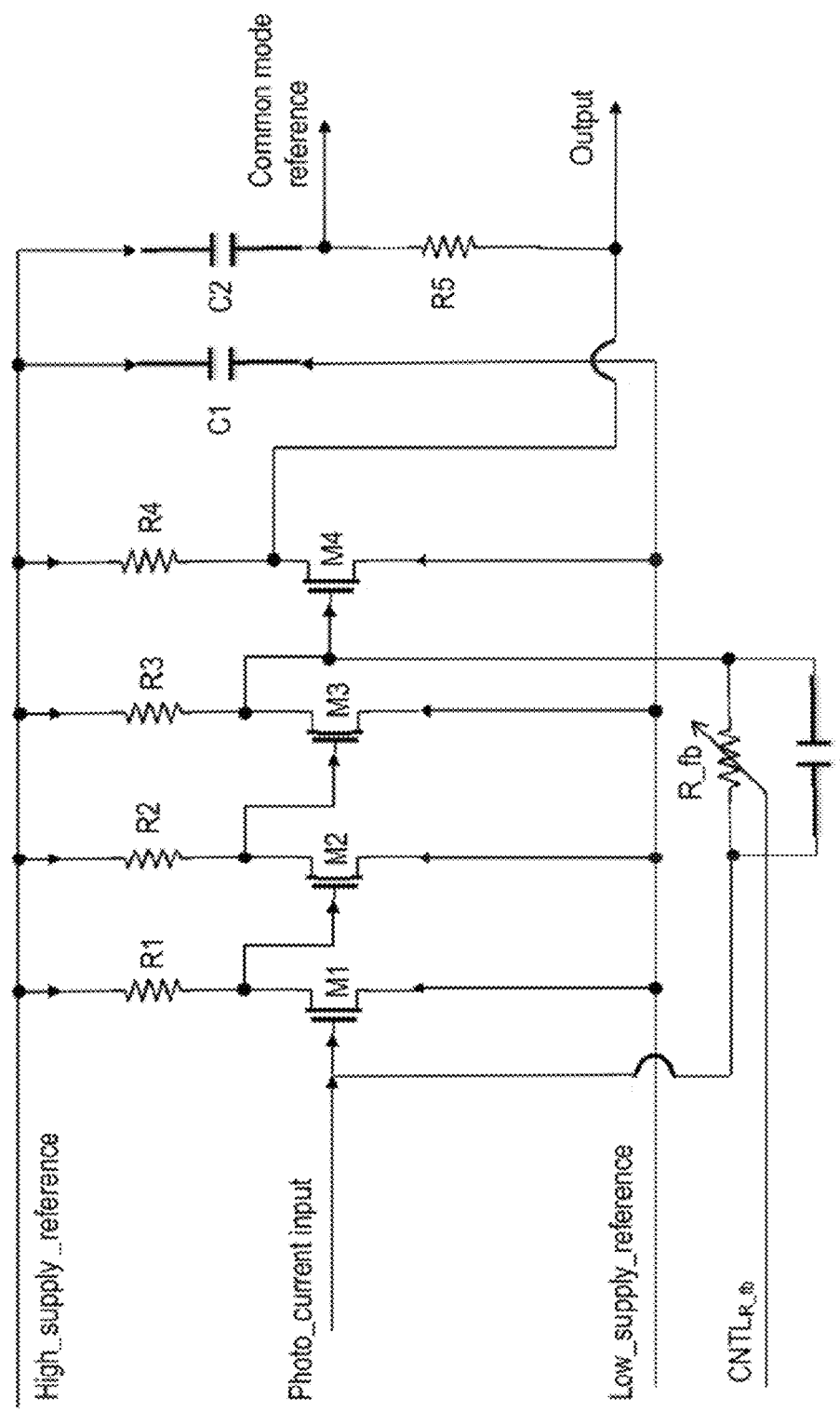
FIG. 3 shows a programmable trans-impedance amplifier (PTIA) architecture in accordance with an example of the disclosure.

FIG. 3 shows a feedback-based PTIA architecture 300 in accordance with an example of the disclosure. As shown, the feedback-based PTIA architecture 300 comprises transistors M1-M4 with respective drain-side resistors R1-R4 between a high_supply_reference and transistors M1-M4. In the feedback-based PTIA architecture 300, a variable resistor (R_fb) and a capacitor C3 are placed in parallel between a drain of transistor M3 and a gate of transistor M1. As shown, the variable resistor R_fb is controlled by a control signal (CTRL$_{r\_fb}$) as described herein. In the feedback-based PTIA architecture 300, a capacitor C1 is placed between high_supply reference and the low_supply_reference. Further, a capacitor C2 and a resistor R5 are placed in series between the high_supply_reference and the drain of transistor M4. The signal at the drain of M4 corresponds to the output signal. Meanwhile, the signal between capacitor C2 and resistor R5 corresponds to the common reference mode signal.

The feedback-based PTIA architecture 300 of FIG. 3 corresponds to a four stage amplifier with four stages of common source amplification. More specifically, stages 1-3 (corresponding to transistors M1, M2, M3) operate as a main gain stage, while stage 4 (corresponding to transistor M4) provides additional gain as well as level shifting for the output signal. A low-pass filter (e.g., corresponding to capacitor C2 and resistor R5) enables a differential output (the output signal and a common mode reference signal) from the feedback-based PTIA architecture 300. More specifically, low-pass filtering may be used for the common mode reference signal and omitted for the output signal of the feedback-based PTIA 106. The feedback resistor R_fb is used to feed the output signal from amplifier stage 3 into the input stage with both DC and negative AC gain. Thus, the input impedance for the example feedback-based PTIA architecture 300 is R_fb/(A+1), where A is the open gain of the first three amplifier stages. In some examples, the variable resistor R_fb corresponds to a programmable passive resistor that is adjusted so that the PTIA input impedance matches a transmission line output impedance.

With the feedback-based PTIA, architecture 300, programmable input impedance adjustment is utilized to match the transmission line impedance and reduce reflection. Further, the feedback-based PTIA architecture 300 utilizes a common mode voltage feedback structure to tolerate high process and voltage variation as well as swing control. Further, the feedback-based PTIA architecture 300 does not use any inductor or cascading structure and thus size is reduced and low voltage operation is possible.

Without limitation to other examples, various values for the feedback-based PTIA architecture 300 are provided herein. For example, the input impedance R$_{ptis}$=R_fb/(A+1), where A is the open gain of the feedback-based PTIA 106 and R_fb is adjustable using the control signal CTRL$_{R\_fb}$ so that R$_{ptis}$=Z0 (the transmission line impedance). Further, M1=5.2μ/40n, M2=M3=M4=8.5μ/40 n. Further, R1=1.6 kΩ, R2=R3=1.0 kΩ, and R4=0.5 kΩ, and R5=24 kΩ. Further, R_fb varies between approximately 1.0 kΩ to 3.0 kΩ to match to Z0=75Ω. Further, C1=200 pF, C2=10 pF, and C3=20 fF. Further, the photo_current input is approximately 20 μA to 100 μA. Further, the gain of the first three amplifier stages is approximately 21 x or 26 db, and the gain of the fourth amplifier stage is approximately 6 dB.

Figure 4:
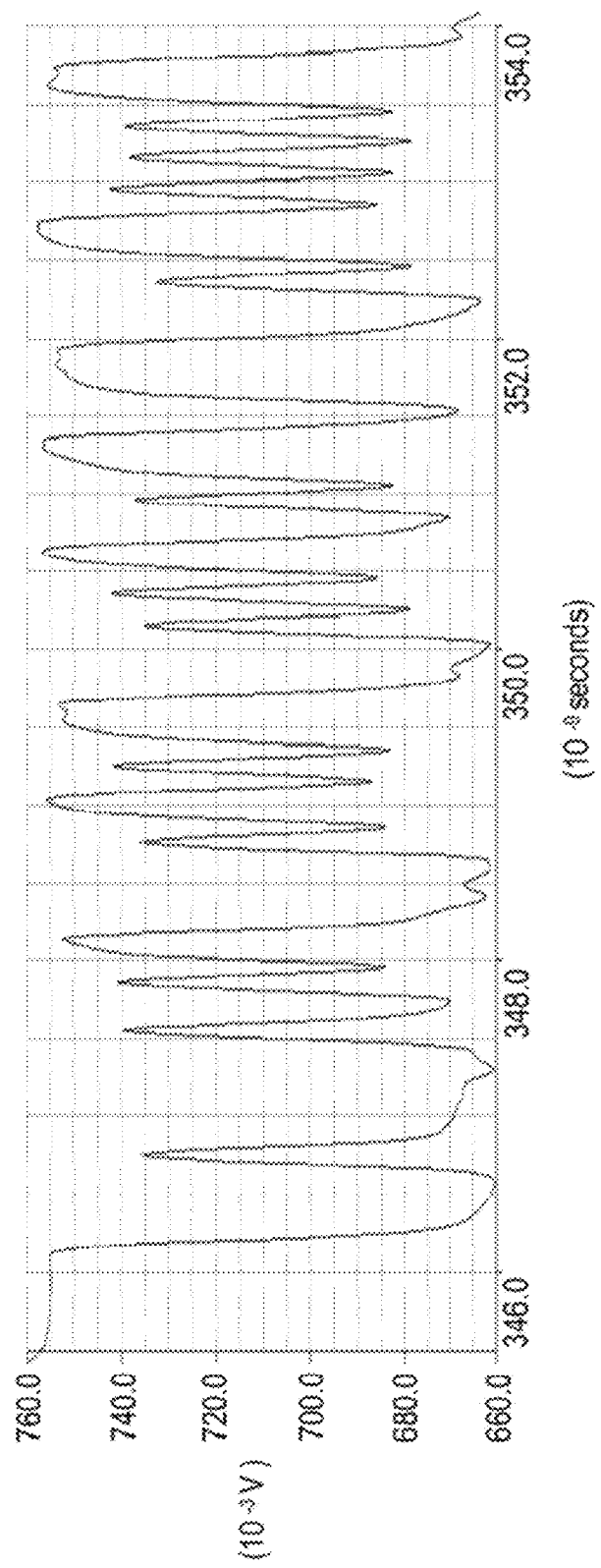
FIG. 4 shows an output signal of an feedback-based PTIA in accordance with an example of the disclosure.

FIG. 4 shows an output signal 400 of a feedback-based PTIA in accordance with an example of the disclosure. As shown, the output signal 400 ranges between $660 \times 10^{-3}$ to $760 \times 10^{-3}$ volts (0.66 to 0.76 volts) during a time period from $346 \times 10^{-9}$ to $354 \times 10^{-9}$ (approximately 0.1 μs).

Figure 5:
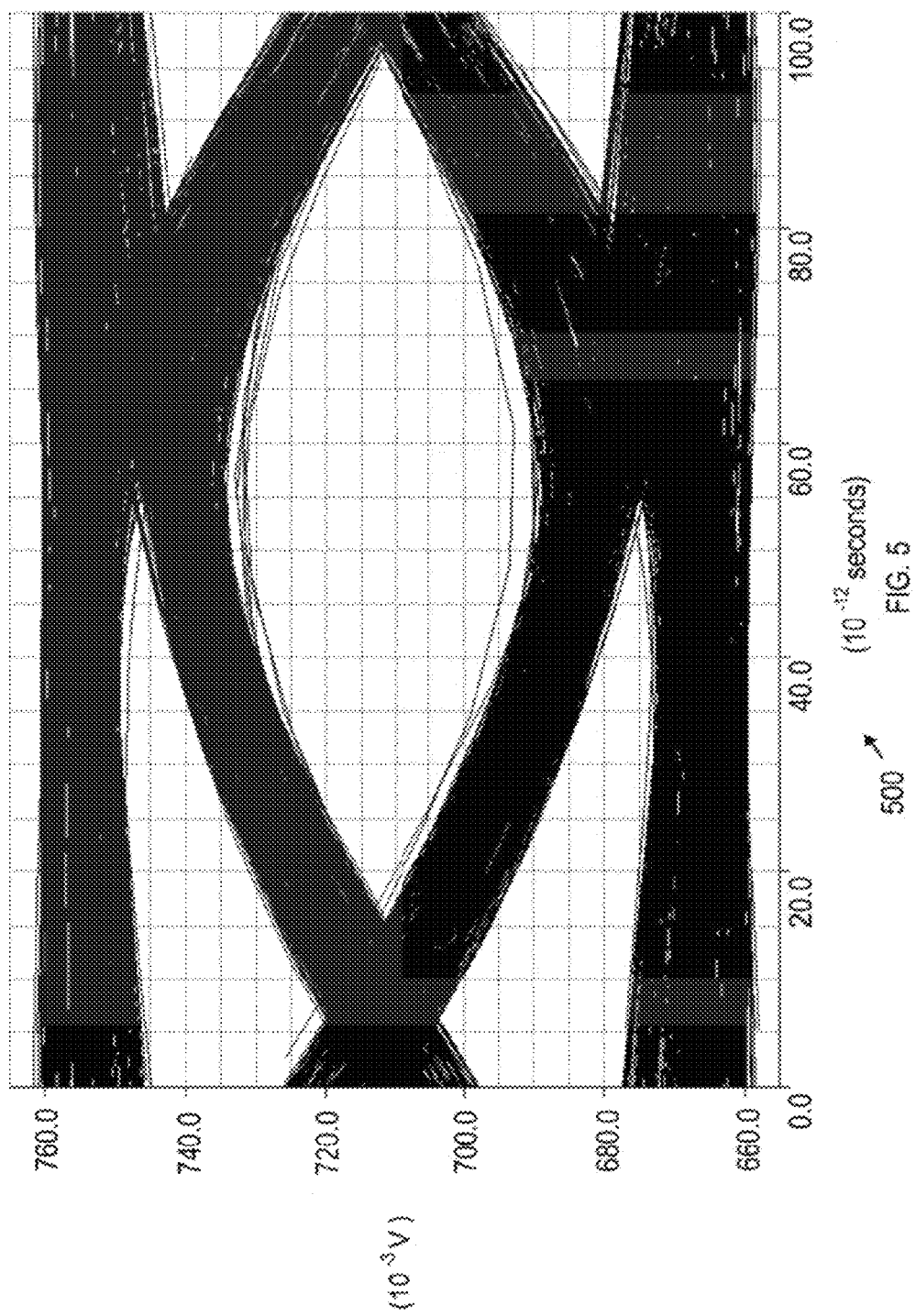
FIG. 5 shows an eye diagram corresponding to the output signal of FIG. 4 in accordance with an example of the disclosure.

FIG. 5 shows an eye diagram 500 corresponding to the output signal 400 of FIG. 4. In the eye diagram 500, the quality of the output signal 400 can be assessed as signal transitions occur between $660 \times 10^{-3}$ to $760 \times 10^{-3}$ volts (0.66 to 0.76 volts) during a time window of $100 \times 10^{-12}$ seconds (100 picoseconds).

Figure 6:
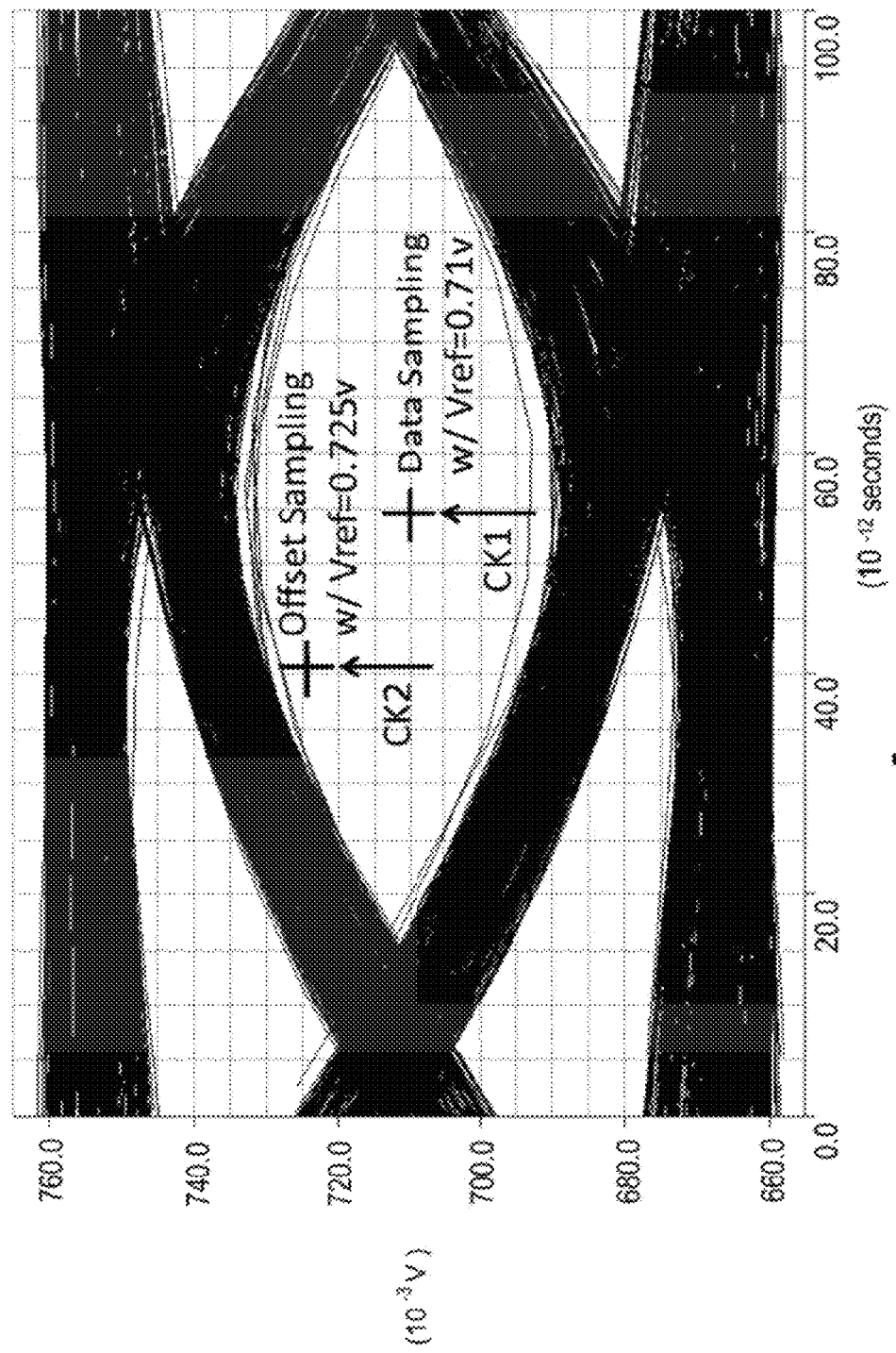
FIG. 6 shows an analysis of the eye diagram of FIG. 5 in accordance with an example of the disclosure.

FIG. 6 shows an analysis 600 of the eye diagram 500 of FIG. 5 in accordance with an example of the disclosure. In the analysis 600, the signal transitions between $660 \times 10^{-3}$ to $760 \times 10^{-3}$ volts (0.66 to 0.76 volts) during a time window of $100 \times 10^{-12}$ seconds (100 picoseconds) are shown as described for the eye diagram 500 of FIG. 5. In addition, analysis 600 shows an offset sampling with $V_{ref}=0.725$ V and a data sampling with $V_{ref}=0.71$ V. The error in the output signal 400 can be determined by XORing the offset sampling and the data sampling. Thereafter, the error can be reduced by adjustment of the input impedance of the feedback-based PTIA 106 as described herein.

Figure 7:
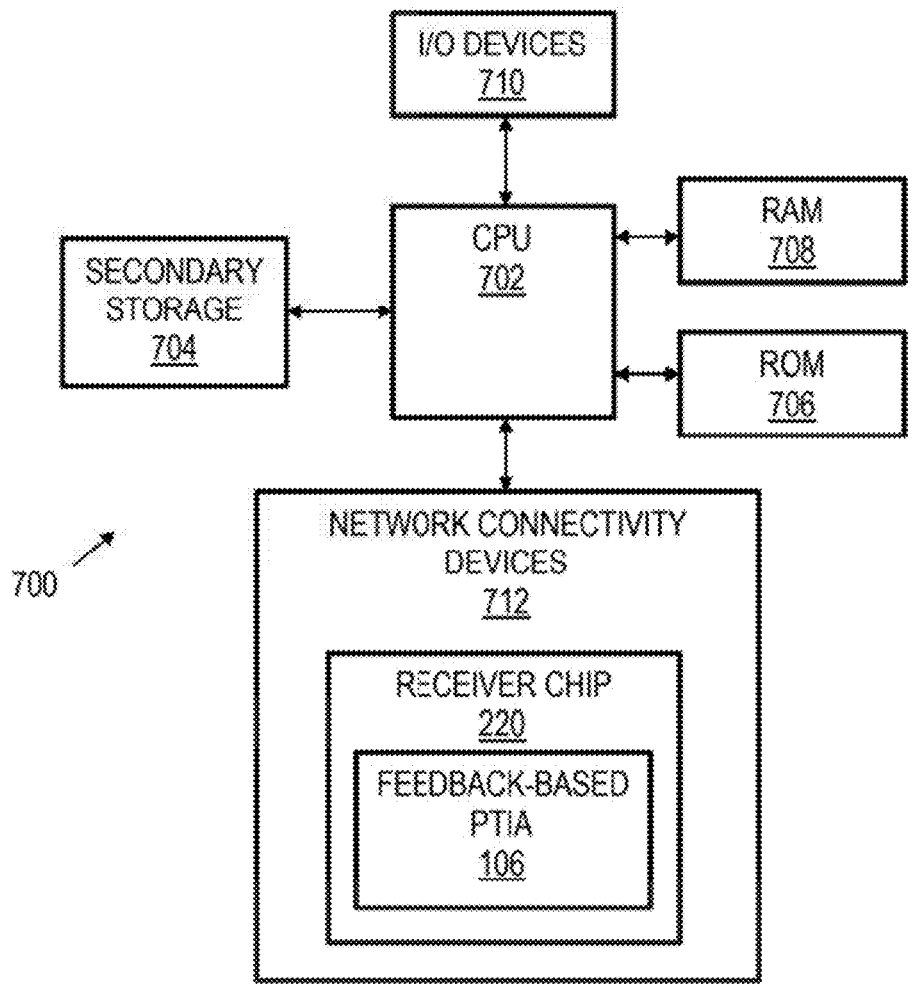
FIG. 7 shows a computer system in accordance with an example of the disclosure.

FIG. 7 shows a computer system 700 in accordance with an example of the disclosure. The computer system 700 may correspond to part of an end-node (data sink) or routing device of an optical communication network. In other words, the components shown for the computer system 700 may be part of a communication device 100 as described for FIG. 1. After reception of data from an optical communication network, the computer system 700 may store, process, and execute the received data.

As shown, the computer system 700 includes a processor 702 (which may be referred to as a central processor unit or CPU) that is in communication with memory devices including secondary storage 704, read only memory (ROM) 706, random access memory (RAM) 708, input/output (I/O) devices 710, and network connectivity devices 712. The processor 702 may be implemented as one or more CPU chips.

It is understood that by programming and/or loading executable instructions onto the computer system 700, at least one of the CPU 702, the HAM 708, and the ROM 706 are changed, transforming the computer system 700 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 704 is typically comprised of one or more disk drives or tape drives and is used for non-volatile storage of data and as an over-flow data storage device if RAM 708 is not large enough to hold all working data. Secondary storage 704 may be used to store programs which are loaded into RAM 708 when such programs are selected for execution. The ROM 706 is used to store instructions and perhaps data which are read during program execution. ROM 706 is a non-volatile memory device which typically has a small memory capacity relative to the larger memory capacity of secondary storage 704. The RAM 708 is used to store volatile data and perhaps to store instructions. Access to both ROM 706 and RAM 708 is typically faster than to secondary storage 704. The secondary storage 704, the RAM 708, and/or the ROM 706 may be referred to in some contexts as computer readable storage media and/or non-transitory computer readable media.

I/O devices 710 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 712 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. As described herein, the computer system 700 may be part of an optical communication network. In such case, the network connectivity devices 712 support optical communication techniques. These network connectivity devices 712 may enable the processor 702 to communicate with the internet or one or more intranets. With such a network connection, it is contemplated that the processor 702 might receive information from the network, or might output information to the network in the course of performing the above-described method steps. Such information, which is often represented as a sequence of instructions to be executed using processor 702, may be received from and outputted to the network, for example, in the form of a computer data signal embodied in a carrier wave. As shown, at least one of network connectivity devices 712 may comprise the receiver chip 220 and/or the feedback-based PTIA 106 described herein.

Such information, which may include data or instructions to be executed using processor 702 for example, may be received from and outputted to the network, for example, in the form of a computer data baseband signal or signal embodied in a earner wave. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor 702 executes instructions, codes, computer programs, scripts which it accesses from hard disk, floppy disk, optical disk (these various disk based systems may all be considered secondary storage 704), ROM 706, RAM 708, or the network connectivity devices 712. While only one processor 702 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 704, for example, hard drives, floppy disks, optical disks, and/or other device, the ROM 706, and/or the RAM 708 may be referred to in some contexts as non-transitory instructions and/or non-transitory information.

In an embodiment the computer system 700 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 700 to provide the functionality of a number of servers that is not directly bound to the number of computers in the computer system 700. For example, visualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by visualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

Figure 8:
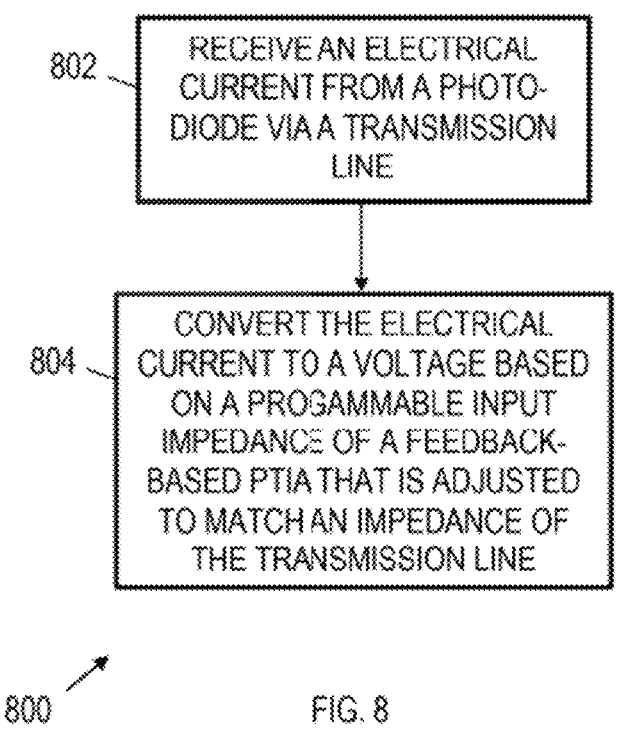
FIG. 8 shows a method in accordance with an example of the disclosure.

FIG. 8 shows a method 800 in accordance with an example of the disclosure. The method 800 may be performed, for example, by a feedback-based PTIA as described herein. As shown, the method 800 comprises receiving an electrical current from a photo-diode via a transmission line (block 802). The electrical current is converted to a voltage based on a programmable input impedance of the feedback-based PTIA at block 804, where the programmable input impedance of the feedback-based PTIA is adjusted to match an impedance of the transmission line. As an example, adjusting the programmable input impedance of the feedback-based PTIA may be based on a control signal to a variable resistor, where the central signal is set according to a signal quality analysis of an output signal of the feedback-based PTIA.

To convert the electrical current to a voltage, the feedback-based PTIA may operate a common gate amplification stage followed by two common source amplification stages. In some examples, converting the electrical current to a voltage also may comprise voltage level shifting at a last stage of amplification for an output signal and for a common mode signal of the feedback-based trans-impedance amplifier. Converting the electrical current to a voltage also may comprise low-pass filtering the common mode signal fed back to a first amplifier stage of the feedback-based PTIA, and omitting low-pass filtering for the output signal of the feedback-based PTIA. For method 800, the feedback-based PTIA is part of an integrated circuit that is separate from the photo-diode and the transmission line. The method 800 also may comprise performing any other operations for setting up or operating a feedback-based PTIA separated from a photo-diode via a transmission line as described herein.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A communication device, comprising:
a photo-diode to convert an optical signal into an electrical current;
a feedback-based trans-impedance amplifier to convert the electrical current to a voltage; and
a transmission line between the photo-diode and the feedback-based trans-impedance amplifier,
wherein the feedback-based trans-impedance amplifier comprises a programmable input impedance that has been matched to an impedance of the transmission line and the programmable input impedance is adjusted based on a control signal to a variable resistor, and wherein the control signal is based on analysis of an output signal of the feedback-based trans-impedance amplifier.

2. The communication device of claim 1, wherein the feedback-based trans-impedance amplifier comprises four amplifier stages.

3. The communication device of claim 1, wherein the feedback-based trans-impedance amplifier comprises four common source amplifier stages.

4. The communication device of claim 1, wherein a last stage of the feedback-based trans-impedance amplifier provides voltage level shifting for an output signal and for a common mode signal of the feedback-based trans-impedance amplifier.

5. The communication device of claim 4, wherein the feedback-based trans-impedance amplifier comprises a low-pass filter to obtain the common mode signal, and wherein low-pass filtering is omitted for the output signal of the feedback-based trans-impedance amplifier.

6. The communication device of claim 1, wherein the feedback-based trans-impedance amplifier is part of an integrated circuit that is separate from the photo-diode and the transmission line.

7. A method for a feedback-based trans-impedance amplifier, comprising:
receiving an electrical current from a photo-diode via a transmission line;
converting the electrical current to a voltage based on a programmable input impedance of the feedback-based trans-impedance amplifier, wherein the programmable input impedance is adjusted to match an impedance of the transmission line, wherein the feedback-based trans-impedance amplifier is part of an integrated circuit that is separate from the photo-diode and the transmission line adjusting the programmable input impedance based on a control signal to a variable resistor; and wherein the control signal is set according to a signal quality analysis of an output signal of the feedback-based trans-impedance amplifier.

8. The method of claim 7, wherein converting the electrical current to a voltage comprises operating a four common source amplification stages.

9. The method of claim 7, wherein converting the electrical current to a voltage comprises voltage level shifting at a last stage of amplification for an output signal and for a common mode signal of the feedback-based trans-impedance amplifier.

10. The method of claim 9, wherein converting the electrical current to a voltage comprises low-pass filtering for the common mode, and omitting low-pass filtering for the output signal of the feedback-based trans-impedance amplifier.

11. An integrated circuit chip, comprising:

a feedback-based trans-impedance amplifier with a programmable input impedance that has been adjusted to match to an impedance of a photo-diode output transmission line external to the integrated circuit chip, wherein the feedback-based trans-impedance amplifier comprises a four common source amplifier stages, and wherein a last stage of the feedback-based trans-impedance amplifier provides voltage level shifting for an output single and for a common mode signal of the feedback-based trans-impedance amplifier, and wherein low-pass filtering is used to obtain the common mode signal and is omitted for the output signal of the feedback-based trans-impedance amplifier.

12. The integrated circuit chip of claim 11, wherein the programmable input impedance has a minimum value and a maximum value separated by at least 20 ohms for matching to a transmission line impedance.

* * * * *